United States Patent [19]

Beasom

[11] Patent Number: 5,841,169

[45] Date of Patent: Nov. 24, 1998

[54] INTEGRATED CIRCUIT CONTAINING DEVICES DIELECTRICALLY ISOLATED AND JUNCTION ISOLATED FROM A SUBSTRATE

[75] Inventor: James Douglas Beasom, Melbourne Village, Fla.

[73] Assignee: Harris Corporation, Melbourne, Fla.

[21] Appl. No.: 671,243

[22] Filed: Jun. 27, 1996

[51] Int. Cl.$^6$ ............................. H01L 23/62; H01L 29/00
[52] U.S. Cl. ...................... 257/355; 257/519; 257/520; 257/524; 257/648
[58] Field of Search ...................... 257/519, 520, 257/521, 524, 355, 513, 517, 648, 650, 106; 437/21, 38, 62, 90, 165

[56] References Cited

U.S. PATENT DOCUMENTS

| 4,468,414 | 8/1984 | Van Vonno . | |
|---|---|---|---|
| 4,475,955 | 10/1984 | Patel | 437/38 |
| 4,561,932 | 12/1985 | Gris et al. | 437/21 |
| 4,720,739 | 1/1988 | Beasom | 257/213 |
| 5,276,350 | 1/1994 | Merrill et al. | 257/106 |
| 5,416,351 | 5/1995 | Ito et al. . | |
| 5,525,824 | 6/1996 | Himi et al. | 257/370 |

FOREIGN PATENT DOCUMENTS

| 0 1456 573 | 6/1985 | European Pat. Off. . |
| 0 532 481 A | 3/1993 | European Pat. Off. . |

OTHER PUBLICATIONS

Sugawara et al., "Novel Dielectrically Isolated Intelligent Power IC Technology Using Vertical Lateral Composite Structure (VCLS)," *IEDM*, pp. 762–765 (1987).

Chan et al., "ESD Reliability and Protection Schemes in SOI CMOS Output Buffers," *IEEE Transactions of Electron Devices*, 42:(10)1816–21 (1995).

Imaizumi et al., "Novel IC Structure for 150V High–Voltage Consumer IC," *IEEE Transactions on Electron Devices*, CE–26:367–74 (1980).

Gilbert et al., "Quasi–Dielectrically Isolated Bipolar Junction Transistor with Subcollector Fabricated Using Silicon Selective Epitaxy," *IEEE Transactions on Electron Devices*, 38:1660–65 (1991).

*Primary Examiner*—Carl W. Whitehead, Jr.
*Attorney, Agent, or Firm*—Jaeckle Fleischmann & Mugel, LLP

[57] ABSTRACT

An integrated circuit comprises a plurality of interconnected semiconductor devices, at least one the interconnected devices being dielectrically isolated from the substrate, and at least one other of the interconnected devices being junction isolated from the substrate. In a preferred embodiment, at least one of the junction isolated devices comprises an ESD protection circuit. The ESD protection circuit, which preferably includes a zener diode and more preferably further includes a bipolar transistor, a diode, and a resistor, is formed in a trench-isolated island comprising a semiconductor layer of a conductivity type opposite to that of the substrate. A heavily doped buried semiconductor region of the same conductivity type as the substrate is formed in the island semiconductor layer adjacent to the substrate. The ESD protection circuit in the integrated circuit of the present invention provides protection from transient high voltage peaks such as those induced by electrostatic discharge (ESD); the lowered thermal resistance of the protection circuit allows generated heat to be dissipated without damage to the components of the integrated circuit.

27 Claims, 4 Drawing Sheets

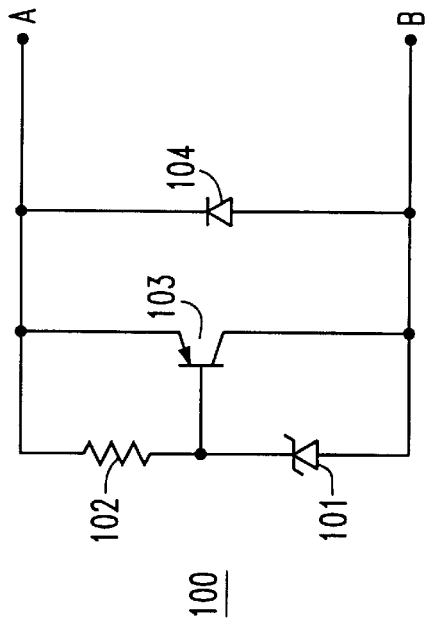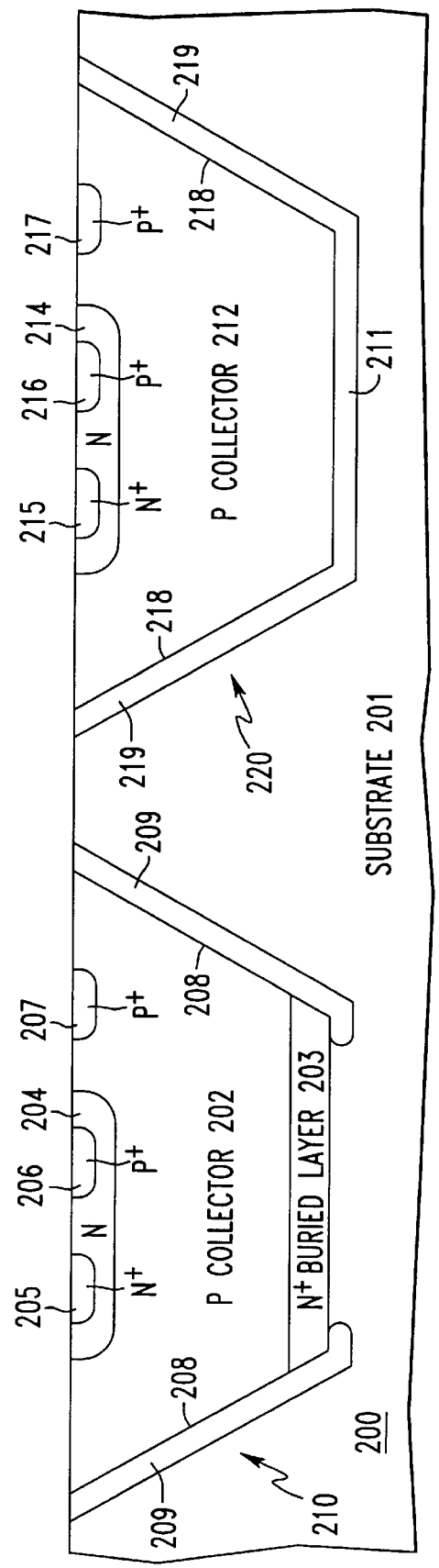

INTEGRATED CIRCUIT CONTAINING DEVICES DIELECTRICALLY ISOLATED AND JUNCTION ISOLATED FROM A SUBSTRATE

FIELD OF THE INVENTION

The present invention relates in general to integrated circuits and in particular to an integrated circuit of semiconductor devices at least one of which is dielectrically isolated from a substrate and at least one other of which is junction isolated from the substrate.

BACKGROUND OF THE INVENTION

Power integrated circuits useful in a variety of applications include high-power semiconductor devices and low-power control logic. Integrating both high- and low-power devices in a single chip would be highly desirable, providing cost savings resulting from fewer separate components and less complex circuitry. In addition, the integrated devices would enable a reduction in the overall size of the circuits and thereby an increase in circuit density.

Electrical isolation of the high- and low-power components of the semiconductor device is required. Isolation techniques fall into one of two basic categories: dielectric isolation and junction isolation. For power integrated circuits, dielectric isolation has the advantage of low parasitic capacitance as well as low thermal generation current. However, because of the large thermal resistance of $SiO_2$ layers, which leads to heat generation, output current of a conventional dielectrically isolated integrated circuit is limited to a very low value. As a solution to this problem, Sugawara et al., "Novel Dielectrically Isolated Intelligent Power IC Technology Using Vertical Lateral Composite Structure (VCLS)," IEDM, 1987, pp. 762–765, proposes an island for a power device whereby current flows from the top surface of the island, through the device in the island, through a hole in the isolation oxide layer at the bottom of the island, through a substrate formed of single crystal silicon, and out the bottom of the substrate. Because the single crystal silicon layer has low electrical and thermal resistance, a high current capacity is possible. Realization of this advantage, however, obviously requires that there be no isolation beneath the power device-containing island.

Chan et al., "ESD Reliability and Protection Schemes in SOI CMOS Output Buffers," IEEE Transactions of Electron Devices, 1995, vol. 42, no. 10, pp. 1816–1821, proposes forming an NMOSFET that absorbs electrostatic discharge current in the substrate of a SIMOX (Separation by Implanted Oxygen) dielectrically isolated wafer. Such a device requires the removal of the surface isolated silicon layer and the underlying isolation oxide to expose the region where the NMOSFET is to be made, which is feasible only if the removed overlying layer is thin enough to leave a structure sufficiently planar to allow simultaneous device forming processes in both the islands and the exposed substrate. Additional complications of isolation arise if more than such circuit is required in the same die.

Imaizumi et al., "Novel IC Structure for 150V High-Voltage Consumer IC," IEEE Transactions on Electron Devices, 1980, vol. CE-26, pp. 367–374, describes a structure with two types of isolation islands of differing epitaxial thickness. Small signal devices are formed in the island with the thin epitaxial layer, high voltage devices in the island with the thick layer. The isolation region is diffused only in the thin layer.

Gilbert et al., "Quasi-Dielectrically Isolated Bipolar Junction Transistor with Subcollector Fabricated Using Silicon Selective Epitaxy." IEEE Transactions on Electron Devices, 1991, vol. 38, pp. 1660–1665, describes a quasi-dielectrically isolated bipolar junction transistor (QDI-BJT) as a high-power device, together with a low voltage NPN. As with the Imaizumi et al. device, the Gilbert, et al. structure has differing epitaxial thicknesses in the low- and high-power areas. The QDI-BJT is constructed by forming a hole in the bottom oxide layer of an oxide-lined trench, then filling the trench by two-stage selective epitaxial growth of single-crystal silicon. The single-crystal silicon, which has about an order of magnitude lower thermal resistance compared to $SiO_2$, provides direct contact between the power device and a heat sink. The isolation junction in the Gilbert et al. QDI-BJT lies between the epitaxial layer and the substrate, and so the isolation depletion region extends from this junction into the substrate.

The above-discussed references make clear the continuing need for integrated circuits that provide for the dissipation of potentially damaging heat from devices such as, for example, an ESD protection device included in the circuit. The integrated circuit of the present invention meets this need.

SUMMARY OF THE INVENTION

An integrated circuit comprises a plurality of interconnected semiconductor devices, at least one of the interconnected devices being dielectrically isolated from the substrate, and at least one other of the interconnected devices being junction isolated from the substrate. The interconnected devices comprising the integrated circuit of the invention include at least one device selected from the group consisting of a PN diode, a bipolar transistor, an MOS transistor, a resistor, and a capacitor. In a preferred embodiment, at least one of the junction isolated devices comprises an electrostatic discharge (ESD) protection circuit.

The ESD protection circuit, which preferably includes a zener diode and more preferably further includes a bipolar transistor, a diode, and a resistor, is formed in a trench-isolated island comprising a semiconductor layer of a conductivity type opposite to that of the substrate. A heavily doped buried semiconductor region of the same conductivity type as the substrate is formed in the island semiconductor layer adjacent to the substrate.

The ESD protection circuit in the integrated circuit of the present invention is protected from transient high voltage peaks such as those induced by electrostatic discharge (ESD); the lowered thermal resistance of the protection circuit allows generated heat to be dissipated without damage to the components of the integrated circuit.

BRIEF DESCRIPTION OF THE DRAWINGS

FIG. 1 is a schematic representation of an ESD circuit in the integrated circuit of the invention.

FIG. 2 depicts a circuit of the invention having PNP transistors on islands dielectrically isolated and junction isolated from the substrate.

DETAILED DESCRIPTION OF THE INVENTION

Figure 3:
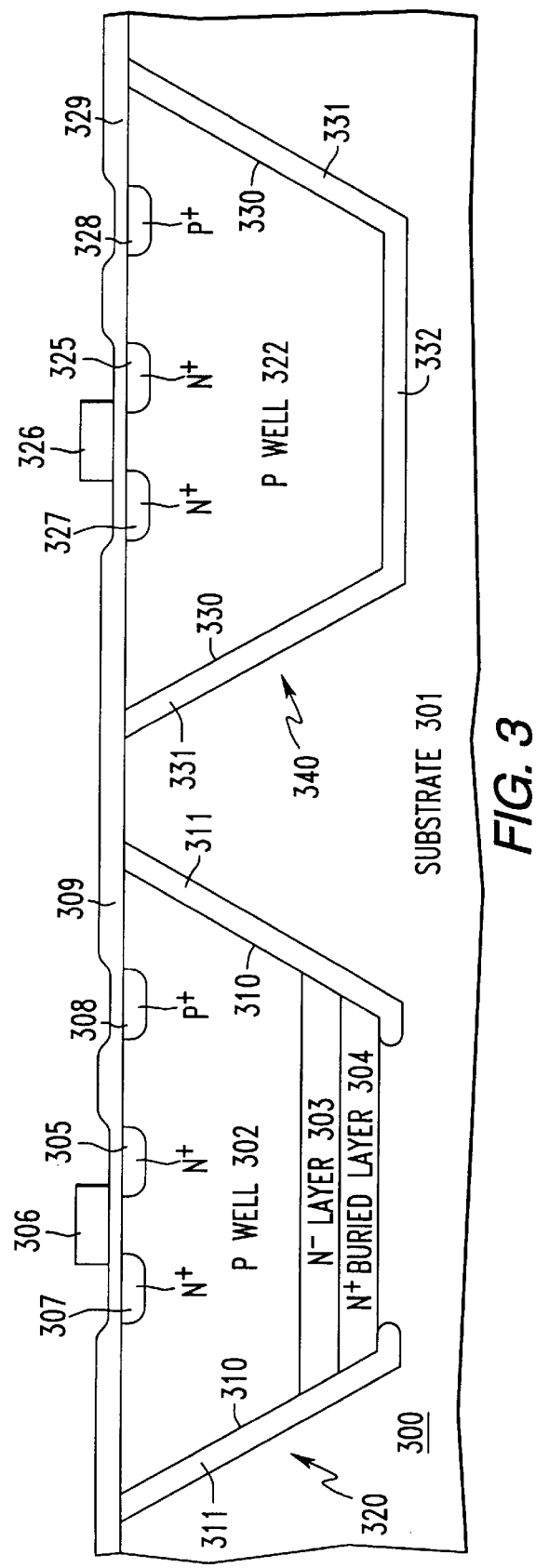
FIG. 3 depicts a circuit of the invention having MOS devices on islands dielectrically isolated and junction isolated from the substrate.

In FIG. 1 is schematically depicted one embodiment of an ESD protection circuit 100, which includes zener diode 101, resistor 102, PNP transistor 103, and diode 104. Circuit 100 is positioned between a signal input, connected at terminal A, and a power supply, connected at terminal B. Positive voltage between terminals A and B is clamped at the total of the voltage of zener diode 101, typically about 6 volts, and the base-emitter voltage of transistor 103. Current delivered by positive voltages in excess of the clamp voltage is passed through transistor 103. Resistor 102 provides a well-defined bias current for zener diode 101. Negative voltage between terminals A and B is clamped by diode 104.

The components of a circuit such as circuit 100 are subject to high transient power dissipation that could raise the temperature high enough to adversely affect the performance of one or more components, thus limiting the protection capability of the circuit. This undesirable result is especially likely to occur with circuits in dielectrically isolated islands, where the thermal resistance of the isolation oxide is much higher than that of the island and substrate silicon. The use of junction isolation for the island comprising ESD protection circuit 100 provides a low thermal resistance path to the substrate and enables circuit 100 to function effectively to protect the interconnected devices of the integrated circuit that are disposed in islands dielectrically isolated from the substrate.

FIG. 2 depicts an integrated circuit 200 of the invention that includes a PNP transistor 210 on a substrate 201, which is preferably polycrystalline silicon. Transistor 210 contains a P-type collector layer 202, which includes a heavily doped N+- buried layer 203 adjacent to substrate 201. The junction between layers 202 and 203 provides junction isolation for transistor 210.

Also included in transistor 210 is N-base 204, N+base contact 205, P+-emitter 206, and P+-collector contact 207. Transistor 210 is defined by trench sidewalls 208, each bearing a dielectric layer 209, preferably of silicon dioxide.

Collector contact 207 and base contact 205 may also function as contacts for the anode and cathode, respectively, of diode 104 (FIG. 1). As will be discussed hereinafter, all of the components of ESD protection circuit 100 (FIG. 1) can be advantageously formed on a single island that is junction isolated from the substrate.

Although substrate 201 is depicted as N-type and is biased to the most positive voltage in the circuit to reverse bias the isolation junction, it may also be P-type, in which case junction isolation is provided by back-to-back PN diodes. This structure would result in higher isolation leakage current because the leakage is the $I_{CEO}$ of the parasitic PNP (collector 202-buried layer 203-P substrate 201) formed by the back-to-back diodes; however, it would also remove constraints on the bias voltage of the substrate.

Also included in the integrated circuit 200 depicted in FIG. 2 is a PNP transistor 220 that is dielectrically isolated from substrate 201 by dielectric layer 211, preferably silicon dioxide. Dielectrically isolated transistor 220 comprises P-type collector layer 212, N-base 214, N+ base contact 215, P+-emitter 216, P+-collector contact 217, and trench sidewalls 218 bearing dielectric layers 219.

FIG. 3 depicts an integrated circuit 300 that includes an MOS device 320 on a substrate 301. Junction isolation is provided by P well 302 adjacent to N⁻ layer 303. An N⁺ buried layer 304, although not required for junction isolation, would reduce the isolation leakage current.

MOS device 320 also includes source 305, gate 306, drain 307, body contact 308, and oxide layer 309. Device 320 is defined by trench sidewalls 310, each bearing a dielectric layer 311, preferably of silicon dioxide.

Also included in the integrated circuit 300 depicted in FIG. 3 is an MOS device 340 that is dielectrically isolated from substrate 301 by dielectric layer 332, preferably silicon dioxide. Dielectrically isolated MOS device 340 comprises P well 322, source 325, gate 326, drain 327, body contact 328, oxide layer 329, and trench sidewalls 330 bearing dielectric layers 331.

As with the bipolar transistor of FIG. 2, components of the ESD protection circuit can be formed concurrently with formation of the MOS device of FIG. 3. For example, a zener diode 101 (FIG. 1) may be embedded in drain 307, as described in U.S. Pat. No. 5,416,351, the disclosure of which is incorporated herein by reference.

In accordance with the invention, the ESD protection circuit is disposed in a low thermal resistance island with dielectric sidewall isolation and junction isolation from the substrate. Such islands can be formed by a variety of known techniques, as described, for example, in U.S. Pat. Nos. 4,468,414 and 4,720,739, the disclosures of which are incorporated herein by reference. Several such techniques are described in the following paragraphs.

To form a low thermal resistance island for an ESD protection circuit, a layer of masking oxide is first grown on a single crystal silicon wafer. A silicon nitride layer is formed over the oxide layer and patterned to be left only in areas corresponding to the bottoms of junction isolated islands. The masking oxide is then patterned to define the bottoms of all islands. The exposed silicon is etched to form V-shaped trenches that are defined by 111 crystal planes. A thick isolation oxide layer is grown on the sidewalls and on the island bottoms. The nitride layer is stripped, and an oxide etch is carried out for a time sufficient to remove the oxide that underlay the nitride, taking care that the isolation oxide layer is not completely removed. Sufficient polycrystalline silicon is then deposited to fill the trenches and to form a layer that will ultimately serve as the integrated circuit substrate. Prior to depositing the polycrystalline silicon, a junction isolating layer is formed in the bottoms of the islands that are to be junction isolated from the substrate.

After ensuring that the surfaces of the polycrystalline silicon layer and the opposite single crystal silicon wafer are parallel, the single crystalline material on the side opposite the polycrystalline silicon is removed by standard methods such as grinding, etching, and polishing until the tips of the V-shaped isolation trenches are intersected and the desired island thickness is achieved. This operation produces tub-shaped islands of single crystal silicon defined by dielectrically isolating sidewalls and disposed on a polycrystalline silicon substrate. The desired devices of the integrated circuit can be formed on these islands as well as on the islands that are dielectrically isolated from the substrate by conventional doping techniques.

Islands without bottom oxide can be formed in SIMOX (Separation by Implanted Oxygen) wafers by the known method of using an oxygen implant mask of the areas where bottom oxide is intended to be absent prior to isolation implant. The mask blocks the oxygen implant from reaching the silicon surface in the masked areas, thereby preventing the formation of oxide in those areas.

In bonded wafers, islands without bottom isolation oxide can be formed using a selective epitaxial trench fill process. In this process, trenches are formed in the wafer in the usual way, except that they are to be utilized not only for isolation but also for island formation, as described in the previously mentioned Gilbert et al. reference. Oxide is formed on the sides and bottoms of the trenches, then selectively removed from horizontal surfaces by reactive ion etching to expose the silicon substrate at the bottom of the trenches. The trenches so treated are filled with single crystal silicon by selective epitaxial deposition.

Figure 4:
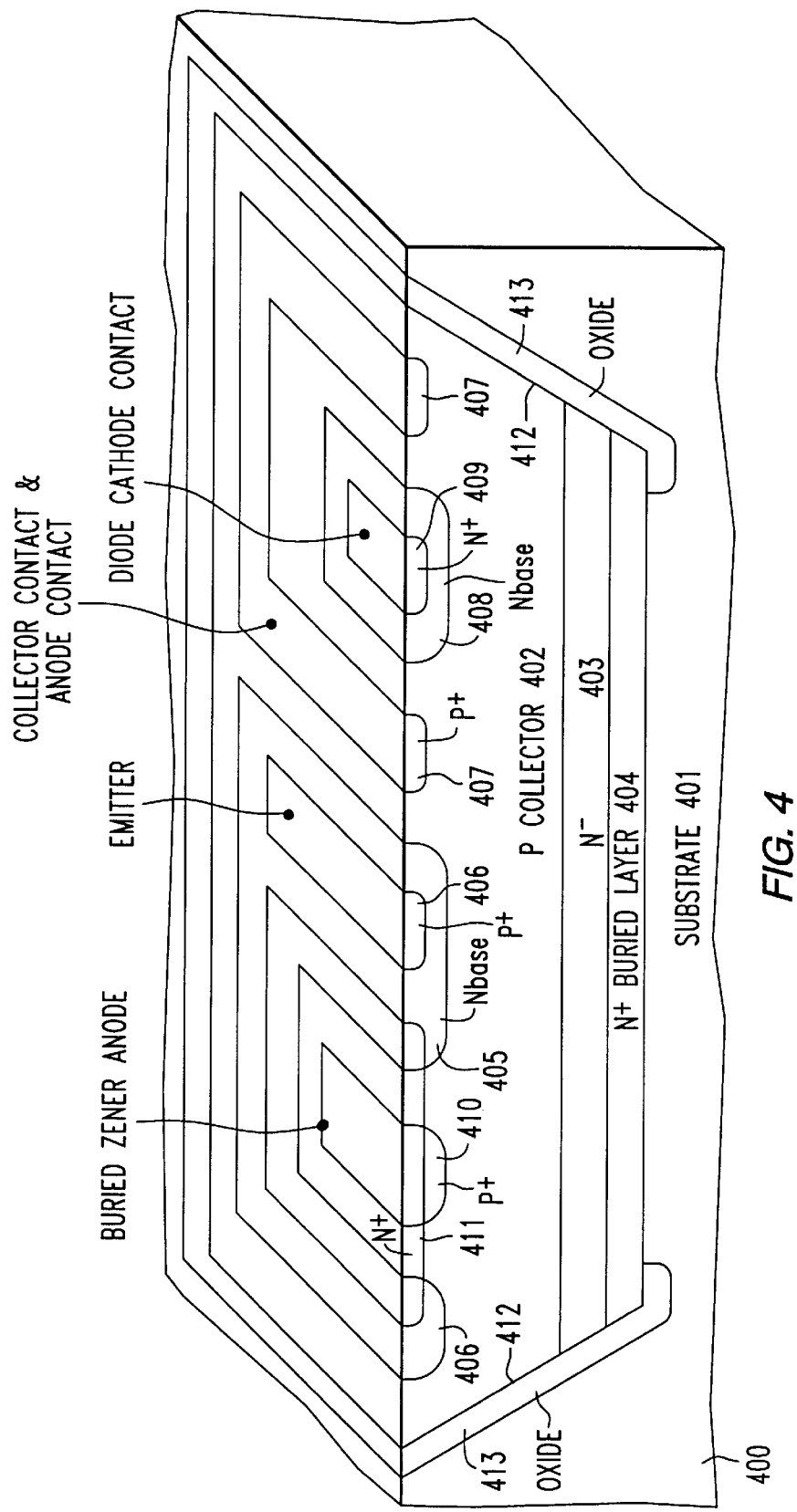
FIG. 4 is a schematic elevation of the ESD circuit represented in FIG. 1.
Figure 5:
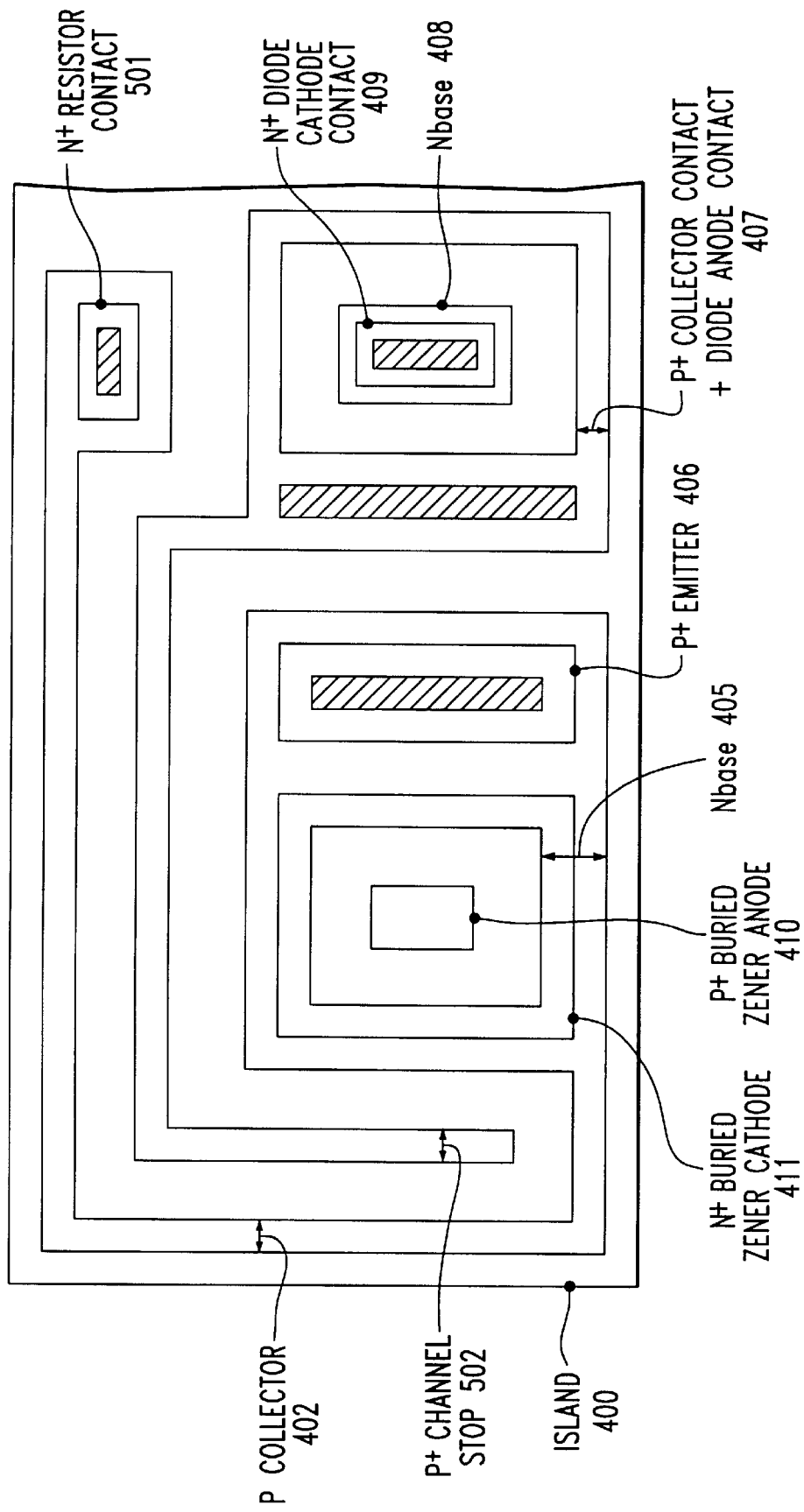
FIG. 5 is a schematic plan view of the ESD circuit represented in FIG. 1.

As previously remarked, all of the components of an ESP protection circuit can be formed on a single junction-isolated island, thereby conserving space. FIGS. 4 and 5 depict the structure of the ESD circuit 100 represented in FIG. 1.

FIG. 4 depicts the structure of the ESD protection circuit 100 (FIG. 1). Not shown is the interconnect that connects the contacts to the end of resistor 102, the emitter of PNP transistor 103, and the cathode of diode 104 to form terminal A, as well as a second interconnect that connects the collector of transistor 103 and the anode of diode 104 to form terminal B.

Protection circuit 100 is formed in an island 400 on a polycrystalline silicon substrate 401. Island 400 contains a P-type collector layer 402, which includes N⁻ layer 403 and heavily doped N⁺ buried layer 404 adjacent to substrate 401. P collector layer 402, together with N base 405, P⁺ emitter 406, and collector contact 407, comprise PNP transistor 103 (FIG. 1). Collector contact 407 also provides the anode contact for diode 104 (FIG. 1), which further comprises P collector layer 402, N base 408, and cathode contact 409.

Also included in island 400 is the P⁺ anode 410 and N⁺ cathode 411 of zener diode 101 (FIG. 1). Defining island 400 are sidewalls 412, which are provided with dielectric layers 413, preferably silicon dioxide.

Anode 410 of zener diode 101 may be made from the same diffusion as is used to form bases of NPN devices elsewhere in the integrated circuit. Zener diode 101 is represented as a buried zener in FIG. 4. A surface zener may be used in place of the buried zener; however, a buried zener diode has the advantage of a more stable breakdown voltage, being substantially unaffected by charges in the dielectric surface.

FIG. 5 is a plan view corresponding to the elevation view of FIG. 4 but also includes N⁺ resistor contact 501 and a channel stop 502. Channel stops such as 502 may be used to surround every opposite conductivity region formed in the island surface to provide complete protection against surface inversion connecting any two of them. A channel stop may be used to enclose even a single layer such as N base 204 (FIG. 2) to prevent the formation of an inversion path running along the island surface and down sidewall 208 to N⁺ buried layer 203.

Substrate 401 of the integrated circuit of the present invention is desirably biased to the most positive voltage in the circuit to reverse bias the isolation junction, which lies in the region between layers 402 and 403. The heavier doping level of the N⁺ buried layer 404 relative to the P collector layer 402 ensures that the depletion layer of the isolation junction does not extend into substrate 401, which minimizes isolation leakage.

The invention has been described in detail with particular reference to preferred embodiments thereof, but it will be understood that variations and modifications can be effected within the spirit and scope of the invention.

What is claimed is:

1. An integrated circuit comprising:
   a semiconductor substrate of a first conductivity type; and
   a plurality of islands comprising interconnected semiconductor devices, at least one of said islands comprising full dielectric isolation on sidewalls and bottom, and at least one other of said islands comprising dielectric sidewalls and junction bottom for providing a low thermal resistance island and to be junction isolated from said substrate.

2. The integrated circuit of claim 1 wherein said interconnected semiconductor devices are formed at substantially the same level on said substrate.

3. The integrated circuit of claim 1 wherein at least one of said devices junction isolated from said substrate comprises an ESD protection circuit.

4. The integrated circuit of claim 1 wherein said substrate comprises polycrystalline silicon.

5. The integrated circuit of claim 4 wherein said substrate is of N conductivity type.

6. The integrated circuit of claim 4 wherein said substrate is of P conductivity type.

7. The integrated circuit of claim 1 wherein said interconnected semiconductor devices include at least one device selected from the group consisting of a PN diode, a bipolar transistor, an MOS transistor, a resistor, and a capacitor.

8. The integrated circuit of claim 3 wherein said ESD protection circuit comprises a zener diode.

9. The integrated circuit of claim 8 wherein said ESD protection circuit further comprises a bipolar transistor.

10. The integrated circuit of claim 9 wherein said bipolar transistor is a PNP transistor.

11. The integrated circuit of claim 9 wherein said bipolar transistor is an NPN transistor.

12. The integrated circuit of claim 9 wherein said ESD protection circuit further comprises a diode.

13. The integrated circuit of claim 9 wherein said ESD protection circuit further comprises a resistor.

14. The integrated circuit of claim 3 wherein said ESD protection circuit is formed in an island comprising a semiconductor layer of a second conductivity type opposite to said first conductivity type, said island being junction isolated from said substrate.

15. The integrated circuit of claim 14 wherein said semiconductor layer includes a heavily doped buried semiconductor region of said first conductivity type adjacent to said substrate.

16. The integrated circuit of claim 14 wherein said island is defined by spaced apart first and second isolation trenches having sidewalls extending through said semiconductor layer to said substrate, each of said sidewalls bearing a layer of dielectric material.

17. The integrated circuit of claim 16 wherein said dielectric material comprises silicon dioxide.

18. The integrated circuit of claim 16 wherein said isolation trenches further include conductive material disposed on said layers of dielectric material.

19. The integrated circuit of claim 18 wherein said conductive material comprises polycrystalline silicon.

20. The integrated circuit of claim 1 wherein a device junction isolated from said substrate is formed in an island comprising a surface layer of a first conductivity type separated from said substrate by a layer of a second conductivity type islands comprising dielectric sidewalls and junction bottom for providing a low thermal resistance island and to be junction isolated from said substrate.

21. The integrated circuit of claim 20 wherein said layer of a second conductivity type is heavily doped.

22. An integrated circuit comprising:
   a semiconductor substrate of a first conductivity type;
   a plurality islands comprising interconnected semiconductor devices, at least one of said islands comprising full dielectric isolation on sidewalls and bottom, and at least one other of said islands being a trench-isolated island comprising a semiconductor layer of a second conductivity type opposite to said first conductivity type, said trench isolated island further comprising dielectric sidewalls and junction bottom for providing a low thermal resistance island; and an ESD protection circuit formed in said trench-isolated island.

23. The integrated circuit of claim 22 wherein said interconnected semiconductor devices are formed at substantially the same level on said substrate.

24. The integrated circuit of claim 22 wherein said ESD protection circuit comprises a zener diode.

25. The integrated circuit of claim 24 wherein said ESD protection circuit further comprises a bipolar transistor.

26. The integrated circuit of claim 25 wherein said ESD protection-circuit further comprises a diode.

27. The integrated circuit of claim 37 wherein said ESD protection circuit further comprises a resistor.

* * * * *